United States Patent
Lee et al.

(10) Patent No.: US 8,086,433 B2
(45) Date of Patent: Dec. 27, 2011

(54) SIMULATION APPARATUS AND METHOD FOR DESIGN OF SENSOR NETWORK

(75) Inventors: Chung Ho Lee, Incheon (KR); Kyung Ok Kim, Daejeon (KR); Sung Woong Shin, Daejeon (KR); Hak Cheol Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 1005 days.

(21) Appl. No.: 11/583,246

(22) Filed: Oct. 18, 2006

(65) Prior Publication Data

US 2007/0124126 A1    May 31, 2007

(30) Foreign Application Priority Data

Nov. 29, 2005 (KR) .......................... 10-2005-0114724

(51) Int. Cl.
*G06F 17/50* (2006.01)
(52) U.S. Cl. ........................................................ 703/13
(58) Field of Classification Search ...................... 703/13
See application file for complete search history.

(56) References Cited

FOREIGN PATENT DOCUMENTS

| | | |
|---|---|---|
| JP | 10-207351 | 8/1998 |
| KR | 100238072 | 10/1999 |
| KR | 100261272 | 4/2000 |
| KR | 10-2000-0054344 | 9/2000 |
| KR | 1020000054344 | 9/2000 |
| KR | 1020040043280 | 5/2004 |
| KR | 1020050024813 | 3/2005 |
| KR | 10-2005-0061857 | 6/2005 |
| KR | 1020050061857 | 6/2005 |
| WO | WO 02/10942 A1 | 2/2002 |
| WO | WO 2005/015525 A1 | 2/2005 |

OTHER PUBLICATIONS

Bren C. Mochocki et al., "H-MAS: A heterogeneous, mobile, ad-hoc sensor-network simulation environment", 2003, Seventh Annual Swarm Users/Researchers Conference, pp. 1-5.*

Faisal Z. Qureshi et al., "Towards Intelligent Camera Networks: A Virtual Vision Approach", Oct. 15, 2005, Proceedings of the 2nd Joint IEEE International Workshop on VS-PETS, pp. 177-184.*

(Continued)

*Primary Examiner* — Paul Rodriguez
*Assistant Examiner* — Russ Guill
(74) *Attorney, Agent, or Firm* — Blakely, Sokoloff, Taylor & Zafman

(57) ABSTRACT

A simulation apparatus and method in relation to a sensor network are provided. The apparatus includes: a space database storing space information; a database storing standard specifications of sensors or sensor nodes; and a modeling unit extracting information on a 3-dimensional (3D) virtual space in which a sensor or sensor node is positioned, from the space database, obtaining the characteristic of the sensor or the sensor node from the standard specification based on the extracted space information and the standard specification of the sensor or the sensor node, and modeling the sensor or the sensor node. According to the apparatus and method, a virtual wireless sensor network system identical to a real world environment can be established, and as a result, the performance of the system can be accurately measured and an optimized design of the system can be efficiently performed.

13 Claims, 3 Drawing Sheets

OTHER PUBLICATIONS

Sung Park et al., "SensorSim: A Simulation Framework for Sensor Networks", 2000, Proceedings of the 3rd ACM International Workshop on Modeling, Analysis and Simulation of Wireless and Mobile Systems, pp. 104-111.*

David Kotz et al., "The mistaken axioms of wireless-network research", 2003, Dartmouth College Computer Science Technical Report TR2003-467, pp. 1-14.*

Denis Gracanin et al., "On modeling wireless sensor networks", 2004, Proceedings of the 18th International Parallel and Distributed Processing Symposium, six unnumbered pages.*

Ian Downard, "Simulating Sensor Networks in NS-2", 2004, Naval Research Laboratory, pp. 1-9.*

David Curren, "A Survey of Simulation in Sensor Networks", 2005, University of Binghamton, nine unnumbered pages.*

I.F. Akyildiz et al., "Wireless sensor networks: a survey", 2002, Computer Networks, vol. 38, pp. 393-422.*

Ahmed Sobeih et al., "J-Sim: A Simulation Environment for Wireless Sensor Networks", 2005, Proceedings of the 38th Annual Simulation Symposium, 13 unnumbered pages.*

Gang Zhou et al., "Impact of radio irregularity on wireless sensor networks", 2004, Proceedings of the 2nd international conference on Mobile Systems, Applications and Services, pp. 125-138.*

Olaf Landsiedel et al., "Accurate prediction of power consumption in sensor networks," May 30, 2005, Proceedings of the 2nd IEEE workshop on Embedded Networked Sensors, pp. 37-44.*

Victor Shnayder et al., "Simulating the power consumption of large-scale sensor network applications," Nov. 3, 2004, Proceedings of the 2nd international conference on Embedded networked sensor systems, pp. 188-200.*

Alex Rogers et al., "Self-organized routing for wireless microsensor networks," May 2005, IEEE Transactions on Systems, Man, and Cybernetics-Part A:Systems and Humans, vol. 35, No. 3, pp. 349-359.*

"SENS: A Sensor, Environment and Network Simulater," by Sameer Sundresh et al.; *Proceedings of the 37th Annual Simulation Symposium*; 2004 IEEE.

* cited by examiner

| SENSOR | SENSING TIME (ms) | DRIVING TIME (ms) | ENERGY QUANTITY CONSUMED TO SENSE ONE VALUE(mJ) |
|---|---|---|---|
| HUMIDITY | 333 | 11 | 0.5 |
| TEMPERATURE | 0.333 | 2 | 0.0056 |
| ACCELEROMETER | 0.9 | 17 | 0.0048 |
| MAGNETOMETER | 0.9 | 17 | 0.2595 |

SIMULATION APPARATUS AND METHOD FOR DESIGN OF SENSOR NETWORK

CROSS-REFERENCE TO RELATED PATENT APPLICATIONS

This application claims the benefit of Korean Patent Application No. 10-2005-0114724, filed on Nov. 29, 2005, in the Korean Intellectual Property Office, the disclosure of which is incorporated herein in its entirety by reference.

BACKGROUND OF THE INVENTION

1. Field of the Invention

The present invention relates to simulation, and more particularly, to an apparatus and method of simulating a wireless sensor network to test and optimize a large-scale wireless sensor network to be used to monitor environments and/or ecosystems, and to manage forest fire and flood.

2. Description of the Related Art

A wireless sensor network to be used to monitor environments and/or ecosystems, and to manage forest fire and flood is installed outdoors. According to the purpose, a variety of sensors, including an image sensor, an ultrasound sensor, an infrared sensor, a temperature sensor, a humidity sensor, and an illumination sensor are disposed to build a system collecting sensing information in real time in a wide area. Accordingly, this wireless sensor network is much influenced by space information such as topography and a feature on the earth and when a network is designed, it is essential to consider the characteristics of sensors, and limited resources (batteries, memories, and CPUs) of sensor nodes. In order to optimize this sensor network, a simulation is generally performed beforehand.

Conventional technologies related to the network simulation are broadly broken down into a sensor network simulation technology and an optimization simulation technology for a wireless mobile communication network and/or a local area network (LAN).

The sensor network simulation technology provides a framework with which a virtual wireless sensor network is built and tested. However, only a sensor network, including a network model of a sensor node and a battery model, and simple environment information are considered and the characteristic of a sensor attached to a sensor node and 3-dimensional (3D) geographical space information at which an actual sensor node is positioned are not considered. Accordingly, the sensor network simulation technology is not appropriate to be used for analyzing the cost and effect of establishing an actual large-scale outdoor sensor network.

The optimization simulation technology for a wireless mobile communication network and/or a LAN is a technology to determine the position of a base station or router and/or hub and/or switch through a comparison and analysis function based on information of a base station, communication coverage, and 2D or 3D geographical information. Accordingly, it is difficult to utilize this technology for design and optimization of a wireless sensor network formed with sensor nodes each built as a small-sized system and having limited resources.

SUMMARY OF THE INVENTION

The present invention provides a simulation apparatus and method for a wireless sensor network providing an accurate simulation result in an outdoor environment.

According to an aspect of the present invention, there is provided a simulation apparatus for a sensor network including: a space database storing space information; a database storing standard specifications of sensors or sensor nodes; and a modeling unit extracting information on a 3-dimensional (3D) virtual space in which a sensor or a sensor node is positioned, from the space database, obtaining the characteristics of the sensor, including a sensing coverage, or the characteristics of the sensor node, including the quantity of energy consumption, based on the standard specifications of the sensor or sensor node, and modeling the sensor or the sensor node.

According to another aspect of the present invention, there is provided a simulation apparatus for a sensor network including: a space database storing space information, including topography information, and facilities information, of a location at which the sensor network is virtually installed; a space modeling unit modeling a 3D virtual space in which the sensor network is installed, based on the topography information and facilities information; and a space display unit displaying the modeled space in a 3D fashion, wherein the topography information is generated in the format of at least one of a 3D image and a digital elevation model of a topography included in an environment in which the sensor network is installed, and the facilities information is generated in the format of at least one of a 3D vector and a texture image of facilities included in the environment in which the sensor network is installed.

According to another aspect of the present invention, there is provided a simulation method for a sensor network including: storing space information; storing standard specifications of sensors or sensor nodes; and extracting information on a 3D virtual space in which a sensor or a sensor node is positioned, from the stored space information, obtaining the characteristics of the sensor, including a sensing coverage, or the characteristics of the sensor node, including the quantity of energy consumption, based on the standard specifications of the sensor or sensor node, and modeling the sensor or the sensor node.

According to another aspect of the present invention, there is provided a simulation method for a sensor network including: storing space information, including topography information, and facilities information, of a location at which the sensor network is virtually installed; modeling a 3D virtual space in which the sensor network is installed, based on the topography information and facilities information; and displaying the modeled space in a 3D fashion, wherein the topography information is generated in the format of at least one of a 3D image and a digital elevation model of a topography included in an environment in which the sensor network is installed, and the facilities information is generated in the format of at least one of a 3D vector and a texture image of facilities included in the environment in which the sensor network is installed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Unlike the conventional mobile communication network or LAN wireless simulation systems, the present invention integrally considers sensor models (effective range characteristics of an image sensor, an ultrasound sensor, an infrared sensor, a temperature sensor, a humidity sensor, and an illumination sensor) attached to a sensor node, limited resource models (batteries, memories, CPUs, etc.) of a sensor node, and 3D space information model (a topography and facilities) based on 3D topographical space information. By doing so, the present invention enables a virtual wireless sensor network identical to a real world environment to be established, and provides a function by which sensors and events are scheduled and tested on the established virtual sensor network.

That is, in the present invention, sensors, such as an image sensor and an ultrasound sensor, whose sensing ranges are determined with respect to the distance and topography are modeled and this model is integrated with 3D space modeling information. By doing so, an environment similar to an actual outdoor environment is provided and environmental elements that can be affected in an operation of a sensor network are applied.

Figure 1:
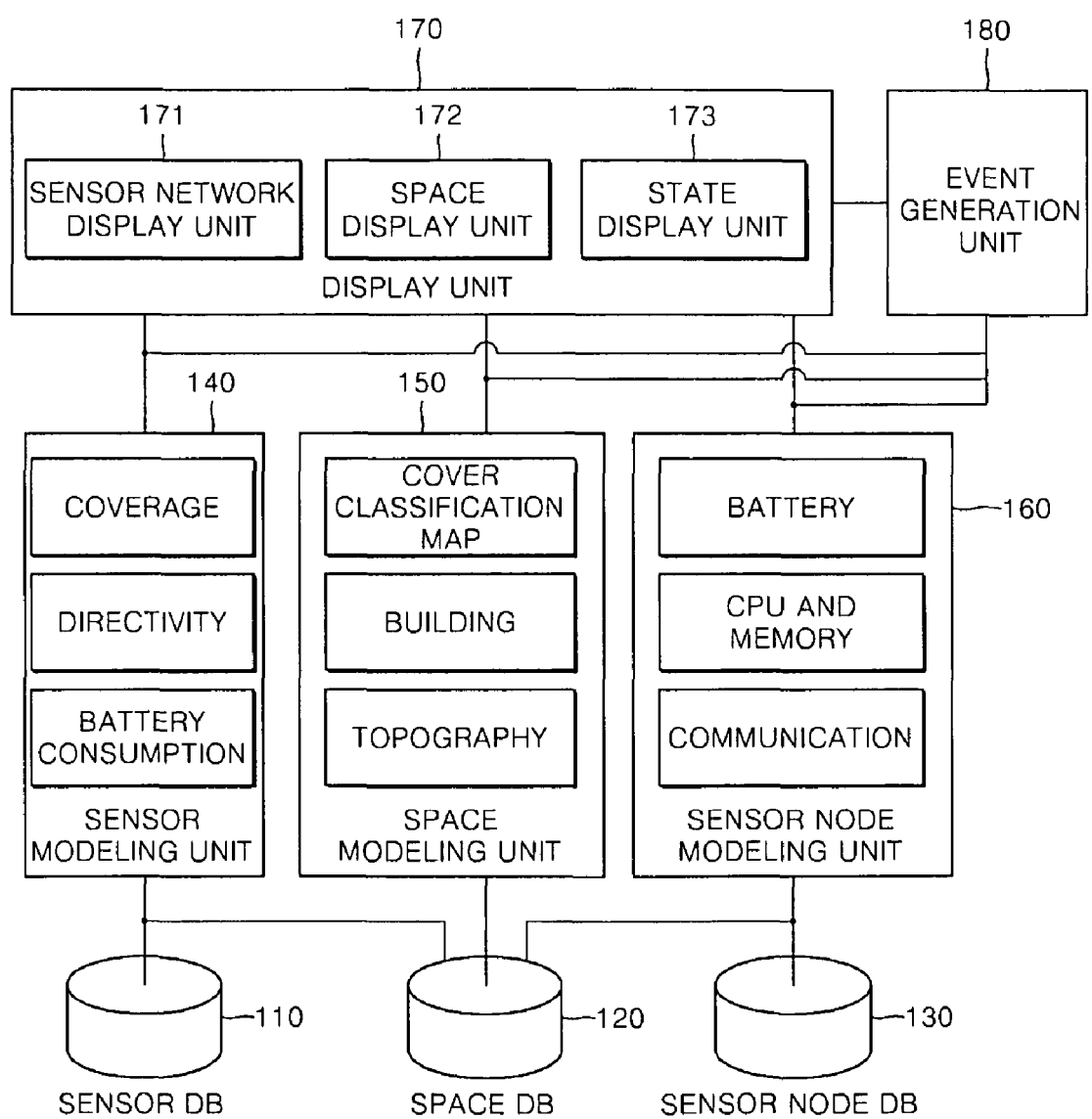
FIG. 1 is a block diagram illustrating a structure of a simulation apparatus in relation to a wireless sensor network according to an embodiment of the present invention.

FIG. 1 is a block diagram illustrating a structure of a simulation apparatus in relation to a wireless sensor network according to an embodiment of the present invention. The simulation apparatus of FIG. 1 is composed of a sensor database (DB) 110, a space DB 120, a sensor node DB 130, a sensor modeling unit 140, a space modeling unit 150, a sensor node modeling unit 160, a display unit 170 and an event generation unit 180.

The sensor DB is attached to a sensor node and stores information on standard specifications of sensors that sense state information on a surrounding environment. Here, examples of sensors may include an image sensor, an ultrasound sensor, an infrared sensor, a temperature sensor, a humidity sensor, and a pressure sensor. Also, examples of standard specifications of sensors may include a sensing coverage, precision, directivity, an energy consumption quantity, and a time taken for sensing.

The space DB 120 stores space information on an environment in which a sensor network is installed. That is, the space DB 120 stores space information to reflect an outdoor environment in which a wireless sensor network may be built according to the present invention. Examples of information items to be stored include land cover information, topography information, and information on facilities including buildings. The land cover information indicates the physical state of a land surface, i.e., forest, grassy land and concrete pavements, by using multiple spectral image data, such as satellite data. The topography information indicates the shape of land surfaces, water systems, utilization of lands, settlements, roads, rails, and the arrangements of other buildings, and is used as basic information indicating a real world environment. The facilities information indicates environmental information on a real world together with the topography information and includes information on types and heights of buildings. Here, examples of the space information may include image information, vector information, and digital elevation model (DEM) information. More specifically, the topography information may be stored in the form of a 3D image and the DEM as information on the topography included in an environment in which a sensor network is to be installed, or may be stored in the form of a 3D vector and a texture image as information on facilities included in the environment in which the sensor network is to be installed.

The sensor node DB 130 stores standard specifications that sensor nodes comply with. Here, examples of the sensor nodes may include an ordinary sensor node for sensing at a sensor network, the state information of an environment, a synchronization node for connection to an external network, and a relay node for relaying the inside of the sensor network. Also, examples of standard specifications of sensor nodes may include the quantity of energy consumption, the capacity of a memory, a communication model, and a CPU.

The sensor modeling unit 140 extracts information on a 3D virtual space in which a sensor is positioned, from the space DB 120, obtains the characteristic of the sensor with respect to the surrounding space based on the extracted space information and the standard specifications of the sensor stored in the sensor DB 110, and models the sensor. That is, by considering the characteristic of a 3D topography with respect to the standard specification that is kept by a sensor itself, the sensor modeling unit 140 models the sensor at an actual environment. Here, examples of the characteristics of the sensor may include a sensing coverage, precision, directivity, the quantity of energy consumption, and a time taken for sensing. The characteristics of the sensor thus modeled are provided to a sensor network display unit 171. For example, in case of an image sensor, the sensing coverage and sensing direction are determined with respect to topography and facilities information, and in case of a noise sensor, the coverage is determined with respect to buildings and a land cover map. Also, since the battery consumption of a sensor may be affected according to surrounding facilities, the quantity of energy consumption may be determined with respect to the surrounding facilities.

Meanwhile, the sensor modeling unit 140 virtually operates the sensor according to a preset schedule based on the characteristics of the modeled sensor so as to obtain a current state of the sensor. Here, an example of the state of the sensor may include remaining battery power. Here, an example of the method of virtually operating the sensor according to the preset schedule may include a method of driving the sensor modeling unit 140 according to a schedule, including a measuring cycle and a report cycle of a sensor set by an event generation unit 180 to be explained later. The current state value of the sensor thus obtained is provided to a state display unit 173.

The space modeling unit 150 models an environment in which the sensor network is disposed based on the topography information and facilities information from the space DB 120. That is, the space modeling unit 150 receives 3D space information, such as a variety of image information and vector information, and obtains 3D structural information. The thus modeled result is provided to the space display unit 172. Here, an example of obtaining 3D structural information with respect to buildings and topography may include a method of predicting variation that is matching information between two images, extracting a part that is the characteristics of a model desired to be generated, and generating a 3D model, a method of estimating a depth from brightness information or geographical structure and generating a 3D model, and a method of reducing obtained 3D information to data of an appropriate size, connecting data through a triangulation method and generating a 3D model. Also, the land cover map is to classify the physical state (forest, grassy lands, and concrete pavements) of land surfaces by using multiple spectral image data, such as satellite data, and is obtained from land cover information.

The sensor node modeling unit 160 extracts information on a 3D virtual space in which a sensor node is positioned, from the space DB 120, obtains the characteristic of the sensor node with respect to the surrounding space based on the extracted space information and the standard specifications of the sensor node stored in the sensor node DB 130, and models the sensor node. That is, the sensor node model 160 receives the standard specifications of the sensor node and the space information provided by the sensor node DB 130 and the space DB 120, respectively, and models the sensor node suitable for an actual environmental characteristics. Here, examples of the characteristics of the sensor node may include a radio wave traveling distance and the quantity of battery consumption. For example, when a sensor node, a relay node and a synchronization node are installed outdoors, the radio wave traveling distance that is one the characteristics of the sensor node is determined with respect to the surrounding topography and facilities information. That is, a communication-related property is determined. Accordingly, the quantity of battery consumption may also be determined according to the radio wave traveling distance. Meanwhile, the sensor node modeling unit 160 may determine the specifications of a sensor node to be modeled based on the type of sensor node that is determined according to resources to be used and the function of the sensor node, and model the sensor node. For example, in a synchronization node for connecting to an external network, a communication-related property may be a property that should be modeled. Meanwhile, the sensor node modeling unit 160 may virtually operate the sensor node according to a preset schedule based on the characteristics of the modeled sensor node so as to obtain a current state of the sensor node. Here, an example of the state of the sensor node may include remaining battery power. Here, an example of the method of virtually operating the sensor node according to the preset schedule may include a method of driving the sensor modeling unit 140 according to a schedule, such as a data acquisition cycle and a report cycle of a sensor set by an event generation unit 180 to be explained later. The current state value of the sensor node thus obtained is provided to a state display unit 173.

The event generation unit 180 generates an event with respect to each sensor and each sensor node in the established virtual sensor network and virtual environment, or schedules a sensing interval and time. For example, according to a schedule a humidity sensor disposed in a predetermined position may be made to report humidity every five minutes and a temperature sensor in another position may be made to report temperature every ten minutes.

The display unit 170 provides a graphic user interface (GUI) environment based on the three models described above, i.e., the sensor model, the space model and the sensor node model. More specifically, the display unit 170 is composed on the sensor network display unit 171, the space display unit 172, and the sate display unit 173.

The sensor network display unit 171 displays a virtual sensor network established based on a modeled sensor and sensor node.

The space display unit 172 displays in a 3D fashion the space modeled by the space modeling unit 150. That is, the space display unit 172 generates and displays a 3D topography and 3D facilities.

The state display unit 173 collects and displays the current states of a sensor and a sensor node obtained by the sensor modeling unit 140 and the sensor node modeling unit 160, respectively. Here, examples of the states of the sensor may include remaining battery power, a sensed value, and precision, and examples of the states of the sensor node may include remaining battery power, a memory occupation ratio, a CPU occupation ratio, and transmission and reception speeds.

Figure 2:
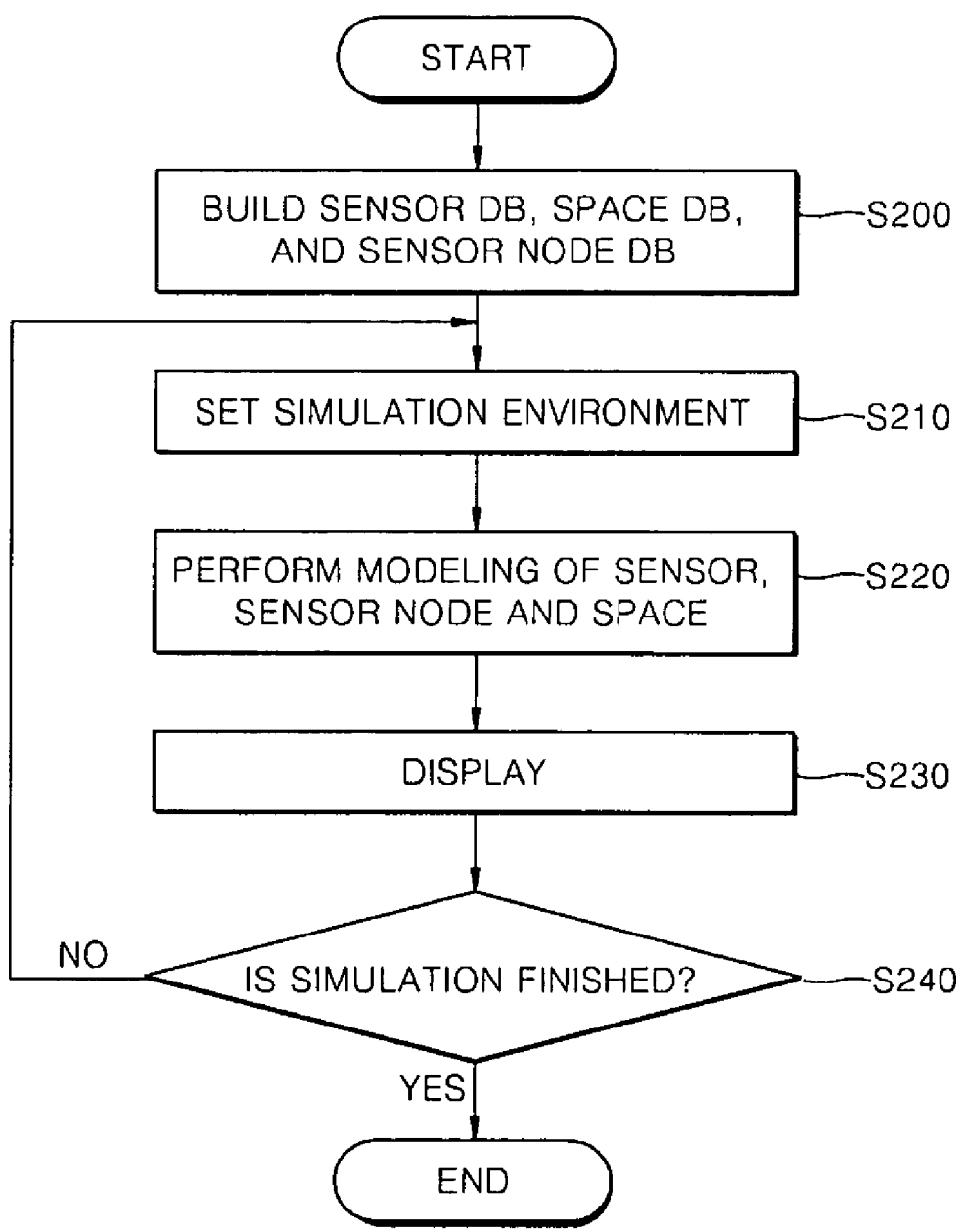
FIG. 2 is a flowchart illustrating an operation of a simulation apparatus and method in relation to a sensor network according to an embodiment of the present invention.

FIG. 2 is a flowchart illustrating an operation of a simulation apparatus and method in relation to a sensor network according to an embodiment of the present invention.

Space information on an environment in which a sensor network is installed is stored in a space DB 120, the standard specifications of sensors are stored in a sensor DB 110, and the standard specifications of sensor nodes are stored in a sensor node DB 130 in operation S200.

A user sets a simulation environment in operation S210. Examples of setting contents may include types of sensors to be installed, types of sensor nodes to be installed, arrangements of sensors and sensor nodes, and operation schedules of sensors and sensor nodes.

According to the set simulation environment, a sensor is modeled by a sensor modeling unit 140, space is modeled by a space modeling unit 150, and a sensor node is modeled by a sensor node modeling unit 160 in operation S220.

According to the set simulation environment the states of the sensor and sensor node operating according to an event generation unit 180 are obtained by the sensor modeling unit 140 and the sensor node modeling unit 160, respectively, and the obtained results are displayed by a state display unit 173 in operation S230. Concurrently with this, by using the sensor and sensor nodes modeled in operation S220, a virtual sensor network may be generated and displayed by a sensor network display unit 171, and also, by using the space modeled in operation S220, a virtual environment may be generated and displayed by a space display unit 172.

The user analyzes the simulation result displayed in a GUI format, determines whether or not to continue the simulation for optimized design in operation S240 and returns to operation S210 or finishes the simulation.

Figures 3, 4:
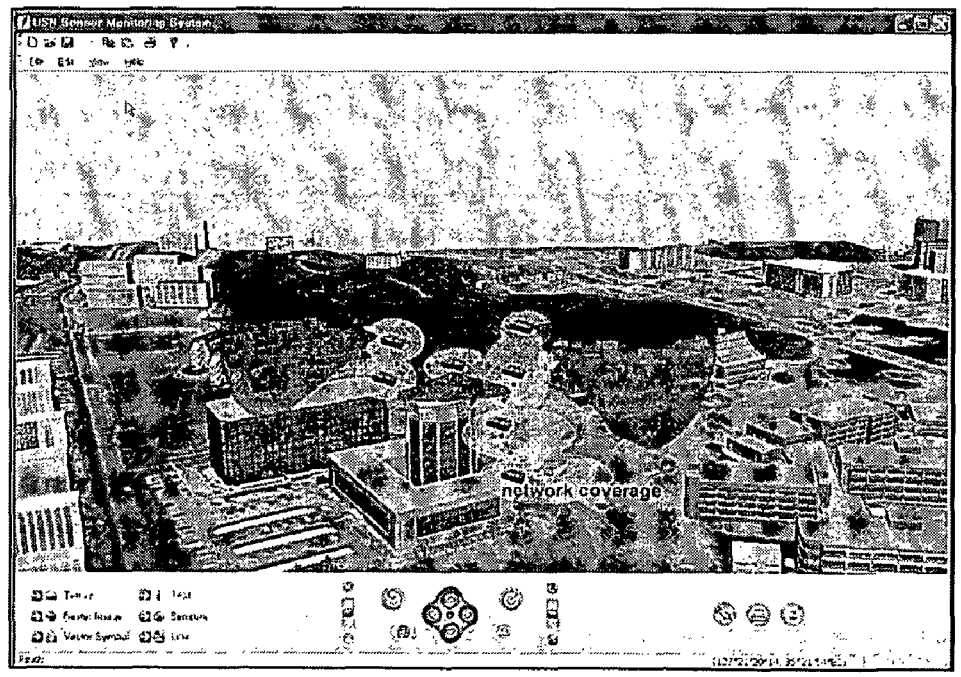
FIG. 3 illustrates an example of the specifications of a sensor stored in a sensor database (DB) of FIG. 1 according to an embodiment of the present invention.
FIG. 4 illustrates an output of an image sensor and a communication coverage in a 3D space model obtained in a simulator according to an embodiment of the present invention.

FIG. 3 illustrates an example of the specifications of a sensor stored in the sensor DB 110 of FIG. 1 according to an embodiment of the present invention. Referring to FIG. 3, it can be seen that there are big differences among quantities of energy consumption by sensors. For example, it can be confirmed that quantities of energy consumption by the humidity sensor and the temperature sensor to sense one value show a 100-times difference. This information is one of items of the sensor DB 110 that should be applied when a sensor network is designed and optimized.

FIG. 4 illustrates an output of an image sensor and a communication coverage in a 3D space model generated by the display unit 170 of FIG. 1. Referring to FIG. 4, the communication coverage of the sensor node is displayed differently with respect to surrounding environment information, and the coverage of an image sensor attached to the sensor node is also displayed differently with respect to the surrounding environment.

The present invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

While the present invention has been particularly shown and described with reference to exemplary embodiments thereof, it will be understood by those of ordinary skill in the art that various changes in form and details may be made therein without departing from the spirit and scope of the present invention as defined by the following claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

According to the present invention, a virtual wireless sensor network identical to one in a real world environment, and by scheduling a sensor and events on the virtually established sensor network the performance of a wireless sensor network can be tested. That is, a large-scale outdoor sensor network which should be built outdoors and is greatly influenced by space information such as an actual topography and altitude, can be virtually established as in a real world environment, by using a sensor node model, a sensor model, and a 3D space model, and simulation can be performed.

Also, according to the present invention, through virtual establishment of a wireless sensor network and performance test, the cost of establishing an actual sensor network can be reduced, the effect of the establishing can be predicted, and optimization of a sensor network and building of a sensor network application system can be easily performed.

Furthermore, according to the present invention, a time taken for developing a variety of application systems based on a large-scale sensor network can be reduced.

What is claimed is:

1. A simulation apparatus for a sensor network comprising:
a space database storing space information;
a database storing standard specifications of sensors or sensor nodes; and
a modeling unit extracting, from the space database, information on a 3-dimensional (3D) virtual space in which a sensor or a sensor node is positioned, obtaining characteristics of the sensor, including a sensing coverage, and characteristics of the sensor node, including a quantity of energy consumption and a radio wave traveling distance, based on the standard specifications, and virtually operating the sensor or the sensor node according to a preset schedule that includes a data acquisition cycle and a report cycle to obtain a current state of the sensor or the sensor node including remaining battery power, wherein the radio wave traveling distance is one of the characteristics of the sensor node determined with respect to surrounding topography and facilities information, and a quantity of battery consumption of the sensor node is determined according to the radio wave traveling distance of the sensor node.

2. The apparatus of claim 1, wherein the characteristics of the sensor include at least one of the sensing coverage, precision, directivity, the quantity of energy consumption, and a time taken for sensing.

3. The apparatus of claim 1, wherein the modeling unit further comprises a state display unit virtually operating the sensor or the sensor node according to the preset schedule based on the characteristics of the sensor or sensor node, obtaining the current state of the sensor or the sensor node, including the remaining battery power, and displaying the obtained current state of the sensor or the sensor node.

4. The apparatus of claim 1, further comprising a sensor network display unit displaying a virtual sensor network environment based on the sensor and the sensor node.

5. The apparatus of claim 1, wherein the modeling unit models the sensor node by determining the characteristics to be modeled based on resources to be used by the sensor node and the type of the sensor node to be determined by the function of the sensor node.

6. A simulation apparatus for a sensor network comprising:
a space database storing space information, including topography information, and facilities information, of a location at which the sensor network is virtually installed;
a space modeling unit modeling a 3D virtual space in which the sensor network is installed, based on the topography information and facilities information; and
a space display unit displaying the modeled space in a 3D fashion,
wherein the topography information is generated in the format of at least one of a 3D image and a digital elevation model of a topography included in an environment in which the sensor network is installed, and the facilities information is generated in the format of at least one of a 3D vector and a texture image of facilities included in the environment in which the sensor network is installed, the sensor network including a plurality of sensor nodes, a characteristic of the sensor nodes being radio wave traveling distance, which is determined with respect to surrounding topography and the facilities information, and a quantity of battery consumption of the sensor nodes is determined according to the radio wave traveling distance of the sensor nodes, wherein the sensor nodes are virtually operated according to a preset schedule that includes a data acquisition cycle and a report cycle to obtain a current state of the sensor nodes including remaining battery power.

7. A simulation method for a sensor network comprising:
storing, in a space database storage, space information;
storing, in a database storage, standard specifications of sensors or sensor nodes; and
extracting, by a modeling unit, information on a 3D virtual space in which a sensor and a sensor node is positioned, from the stored space information, obtaining characteristics of the sensor, including a sensing coverage, and characteristics of the sensor node, including quantity of energy consumption and a radio wave traveling distance, based on the standard specifications, and virtually operating the sensor or the sensor node according to a preset schedule that includes a data acquisition cycle and a report cycle to obtain a current state of the sensor or the sensor node including remaining battery power, wherein the radio wave traveling distance is a characteristic of the sensor node determined with respect to surrounding topography and facilities information, and a quantity of battery consumption of the sensor node is determined according to the radio wave traveling distance of the sensor node.

8. The method of claim 7, wherein the characteristics of the sensor include at least one of the sensing coverage, precision, directivity, the quantity of energy consumption, and a time taken for sensing.

9. The method of claim 7, wherein the virtually operating of the sensor or the sensor node comprises:
virtually operating the sensor or the sensor node according to the preset schedule based on the characteristics of the sensor or sensor node, obtaining the current state of the sensor or the sensor node, including the remaining battery power, and displaying the obtained current state of the sensor or the sensor node.

10. The method of claim 7, further comprising displaying a virtual sensor network environment based on the sensor and the sensor node.

11. The method of claim 7, wherein in the virtually operating of the sensor node, the sensor node is modeled by determining the characteristics to be modeled based on resources to be used by the sensor node and the type of the sensor node to be determined by the function of the sensor node.

12. A non-transitory computer readable recording medium in a data storage device, the non-transitory computer readable recording medium having embodied thereon a computer program when executed by a computer system, causes the computer system to perform the method of claim 7.

13. A simulation method for a sensor network comprising:
storing, in a space database storage, space information, including topography information, and facilities information, of a location at which the sensor network is virtually installed;
modeling, by a modeling unit, a 3D virtual space in which the sensor network is installed, based on the topography information and facilities information; and
displaying, by a display unit, the modeled space in a 3D fashion,
wherein the topography information is generated in the format of at least one of a 3D image and a digital elevation model of a topography included in an environment in which the sensor network is installed, and the facilities information is generated in the format of at least one of a 3D vector and a texture image of facilities included in the environment in which the sensor network is installed, the sensor network including a plurality of sensor nodes, a characteristic of the sensor nodes being radio wave traveling distance, which is determined with respect to surrounding topography and the facilities information, and a quantity of battery consumption of the sensor nodes is determined according to the radio wave traveling distance of the sensor nodes, wherein the sensor nodes are virtually operated according to a preset schedule that includes a data acquisition cycle and a report cycle to obtain a current state of the sensor nodes including remaining battery power.

* * * * *